(12) United States Patent
Huang et al.

(10) Patent No.: US 12,088,941 B2
(45) Date of Patent: Sep. 10, 2024

(54) IMAGE SENSOR EMPLOYING AVALANCHE DIODE AND SHARED OUTPUT CIRCUIT

(71) Applicant: PixArt Imaging Inc., Hsin-Chu County (TW)

(72) Inventors: Sen-Huang Huang, Hsin-Chu County (TW); Tso-Sheng Tsai, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 18/231,435

(22) Filed: Aug. 8, 2023

(65) Prior Publication Data

US 2023/0403481 A1 Dec. 14, 2023

Related U.S. Application Data

(60) Continuation of application No. 17/983,099, filed on Nov. 8, 2022, now Pat. No. 11,765,482, which is a continuation of application No. 17/562,326, filed on Dec. 27, 2021, now Pat. No. 11,528,444, which is a continuation of application No. 17/172,147, filed on Feb. 10, 2021, now Pat. No. 11,245,865, which is a continuation-in-part of application No. 16/872,626, filed on May 12, 2020, now Pat. No. 11,102,439, which is a division of application No. 16/258,673, filed on Jan. 28, 2019, now Pat. No. 10,715,756.

(51) Int. Cl.
| | | |
|---|---|---|
| H04N 25/75 | (2023.01) | |
| H01L 27/146 | (2006.01) | |
| H01L 31/107 | (2006.01) | |
| H04N 25/76 | (2023.01) | |

(52) U.S. Cl.
CPC ....... *H04N 25/75* (2023.01); *H01L 27/14612* (2013.01); *H01L 27/14643* (2013.01); *H04N 25/76* (2023.01); *H01L 31/107* (2013.01)

(58) Field of Classification Search
None
See application file for complete search history.

(56) References Cited

U.S. PATENT DOCUMENTS

| | | |
|---|---|---|
| 7,969,476 B1 | 6/2011 | Koifman |
| 2016/0119565 A1 | 4/2016 | Fujita et al. |

*Primary Examiner* — Mark T Monk
(74) *Attorney, Agent, or Firm* — WPAT, PC

(57) ABSTRACT

There is provided an image sensor employing an avalanche diode. The image sensor includes a plurality of pixel circuits arranged in a matrix, a plurality of pulling circuits, a plurality of output circuits and a global current source circuit. Each of the plurality of pixel circuits includes a single photon avalanche diode and a P-type or N-type select switch transistor. Each of the plurality of pulling circuits is arranged corresponding to one pixel circuit column. The global current source circuit is used to form a current mirror with each of the plurality of pulling circuits. Each of the plurality of output circuits is shared by at least two pixel circuits.

16 Claims, 12 Drawing Sheets

IMAGE SENSOR EMPLOYING AVALANCHE DIODE AND SHARED OUTPUT CIRCUIT

CROSS REFERENCE TO RELATED APPLICATION

The present application is a continuation application of U.S. Ser. No. 17/983,099, filed on Nov. 8, 2022, which is a continuation application of U.S. Ser. No. 17/562,326, filed on Dec. 27, 2021, which is a continuation application of U.S. Ser. No. 17/172,147, filed on Feb. 10, 2021, which is a continuation-in-part application of U.S. Ser. No. 16/872,626, filed on May 12, 2020, which is a divisional application of U.S. Ser. No. 16/258,673, filed on Jan. 28, 2019, the disclosures of which are hereby incorporated by reference herein in their entirety.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to the photon detection technology and, more particularly, to an image sensor employing a single photon avalanche diode (SPAD) in the pixel circuit. The quenching and readout circuit of the SPAD has a low limitation on minimum pixel unit and a high fill factor.

2. Description of the Related Art

Single photon detection is a good choice in dealing with weak light environment and high frequency light signals.

For example, a single photon avalanche diode (SPAD) can be used as a detector for weak light, and has the benefits of high avalanche gain, fast response and low power consumption. When each photon is received by the SPAD, an avalanche current is triggered to respond that one photon is detected. A pulse generated by the avalanche current can be referred as an event.

However, the SPAD cannot accomplish the quenching by itself, and thus a quenching circuit is required in operation so as to quickly pull down a bias voltage of the SPAD to be lower than a breakdown voltage after an avalanche occurs. Then, the bias voltage is quickly pulled up to be higher than the breakdown voltage to cause the SPAD to return to a photon detecting state.

One requirement of the quenching circuit is not to decrease the fill factor.

One conventional method is to form an independent 3D quenching circuit outside a pixel circuit. Because the pixel circuit and the quenching circuit are not arranged in the same chip, the impact upon the fill factor is reduced.

Another conventional method is to use a logic circuit having a combination of p-type and N-type transistors to implement a quenching circuit. However, in this kind of quenching circuit, two Nwells having different potentials have to be formed within a signal pixel unit. Due to the design rules checking, a minimum distance should be maintained between the Nwells having different potentials that causes a limitation on the minimum pixel size.

Accordingly, it is necessary to provide a quenching circuit of the SPAD having a low limitation on minimum pixel unit and a high fill factor.

SUMMARY

The present disclosure provides an image sensor incorporating an SPAD within each pixel circuit, and the SPAD has a low limitation on minimum pixel size and a high fill factor.

The present disclosure provides an image sensor including a pixel array and a readout line. The pixel array includes a pixel circuit group arranged in a column of the pixel array. The pixel circuit group includes a pair of a first avalanche diode and a second avalanche diode, a resistive transistor, a pull down transistor and a second switch transistor. The first avalanche diode and the second avalanche diode of the pair are jointly coupled to a node and generate avalanche currents corresponding to a first exposure signal and a second exposure signal respectively. The resistive transistor is connected to the node for draining a voltage of the node to a predetermined voltage. A gate of the pull down transistor is connected to the node. A gate of the second switch transistor is configured to receive the first exposure signal or the second exposure signal corresponding to different exposure periods to generate a first output voltage or a second output voltage. The readout line is coupled to a drain of the second switch transistor to output the first output voltage or the second output voltage.

The present disclosure further provides an image sensor including a pixel array, an output circuit and a readout line. The pixel array includes a plurality of pixel circuits arranged in one pixel circuit column Each of the pixel circuits includes an avalanche diode coupled to a node and generating an avalanche current corresponding to an exposure signal. The output circuit is configured to be coupled to the one pixel circuit column, and includes a resistive transistor, a pull down transistor and a second switch transistor. The resistive transistor is connected to the node for draining a voltage of the node to a predetermined voltage. A gate of the pull down transistor is connected to the node. A gate of the second switch transistor is configured to receive the exposure signal corresponding to an exposure period to generate an output voltage. The readout line is coupled between the node and each of the pixel circuits in the one pixel circuit column.

The present disclosure further provides an image sensor including a pixel array and a readout line. The pixel array includes a pixel circuit group arranged in a column of the pixel array. The pixel circuit group includes a photon-detect unit, a resistive transistor, a pull down transistor and a switch transistor. The photon-detect unit includes a first avalanche diode and a second avalanche diode jointly coupled to a node and generating avalanche currents corresponding to a first exposure signal and a second exposure signal respectively. The resistive transistor is connected to the node for draining a voltage of the node to a predetermined voltage. A gate of the pull down transistor is connected to the node. A gate of the switch transistor is configured to receive the first exposure signal or the second exposure signal corresponding to different exposure periods to generate a first output voltage or a second output voltage. The readout line is coupled to a drain of the switch transistor to output the first output voltage or the second output voltage.

In the quenching and readout circuit of the SPAD of the present disclosure, each pixel only has N-type transistors or P-type transistors, and thus each pixel only has one Nwell.

In the image sensor of the present disclosure, as a pulling circuit is arranged outside of each pixel, it can neither become a limitation on the minimum pixel unit nor affect the fill factor.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
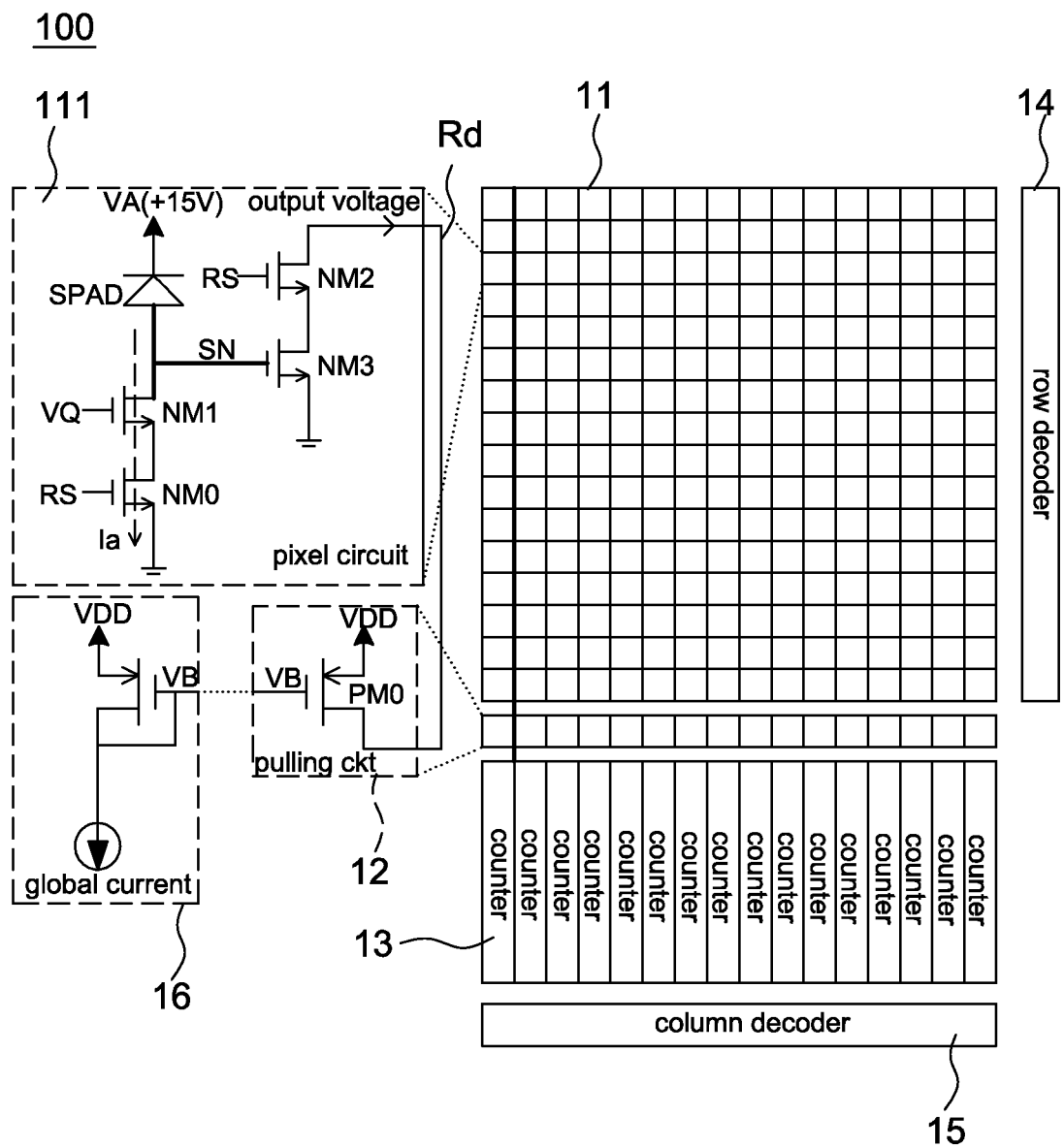
FIG. 1 is a schematic diagram of an image sensor according to a first embodiment of the present disclosure.

Referring to FIG. 1, it is a schematic diagram of an image sensor 100 according to a first embodiment of the present disclosure. The image sensor 100 is used to detect extremely weak light and high frequency signals, and thus a single photon avalanche diode (SPAD) is employed to detect photon events. A processor generates an image frame by counting photon events of every pixel to perform the object tracking, gesture recognition, 3D image construction, and biological feature detection and recognition.

The image sensor 100 includes a pixel array 11, a plurality of pulling circuits 12, a plurality of counters 13, a row decoder 14, a column decoder 15 and a global current source circuit 16, wherein the row decoder 14 and the column decoder 15 are used to determine a pixel position in the pixel array 11 that is being exposed and outputting a detected signal (e.g., pulses mentioned below). The operation of the row decoder 14 and the column decoder 15 is known to the art and is not a main objective of the present disclosure, and thus details thereof are not described herein.

The pixel array 11 includes a plurality of pixel circuits 111 (e.g., FIG. 1 showing 16×16 pixels as an example) arranged in a matrix. Each of the plurality of pixel circuits 111 has an avalanche diode SPAD and four N-type transistors including a resistive transistor NM1, a first switch transistor NM0, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a node SN. When a voltage difference (or bias) between the cathode and the anode exceeds a breakdown voltage of the avalanche diode SPAD, an avalanche current Ia is generated. In the first embodiment, the resistive transistor NM1 and the first switch transistor NM0 of the pixel circuit 111 are used to form a quenching circuit, which causes the voltage difference between the cathode and the anode to be lower than the breakdown voltage for quenching when the avalanche diode SPAD generates the avalanche current Ia. The pull down transistor NM3 and the second switch transistor NM2 of the pixel circuit 111 are used to form a readout circuit, which reads an output voltage of the pixel circuit 111 to a corresponding column counter 13.

A drain of the resistive transistor NM1 is connected to the node SN to connect to the anode of the avalanche diode SPAD. A gate of the resistive transistor NM1 is used to receive a fixed voltage signal VQ and be turned on or off thereby. In the first embodiment, the resistive transistor NM1 is used to form a controllable resistor, and resistance of the controllable resistor is determined according to a voltage value of the fixed voltage signal VQ. When the avalanche diode SPAD receives a photon in the detecting state and the first switch transistor NM0 is conducted, a voltage drop is formed on the resistive transistor NM1 to cause the voltage difference between the cathode and the anode of the avalanche diode SPAD to be lower than the breakdown voltage for the quenching.

A drain of the first switch transistor NM0 is connected to a source of the resistive transistor NM1. A gate of the first switch transistor NM0 is used to receive an exposure signal RS, which is a row selection signal and, for example, generated by the row decoder 14. A source of the first switch transistor NM0 is connected to a ground voltage.

A gate of the pull down transistor NM3 is connected to the node SN to connect to the anode of the avalanche diode SPAD. A source of the pull down transistor NM3 is connected to the ground voltage. The pull down transistor NM3 is used as a discharging path of a voltage on the node SN, and a discharging speed is determined according to resistance of the resistive transistor NM1 and stray capacitance of the circuit. The resistance and the stray capacitance are values determined in circuit manufacturing.

A gate of the second switch transistor NM2 also receives the exposure signal RS, and controlled by the exposure signal RS to be turned on or off together with the first switch transistor NM0. A source of the second switch transistor NM2 is connected to a drain of the pull down transistor NM3. A drain of the second switch transistor NM2 is used to generate an output voltage of the associated pixel circuit 111.

Each of the plurality of pulling circuits 12 is used to connect to the drain of the second switch transistor NM2 of each pixel circuit 111 in one pixel circuit column via a readout line Rd for reading the output voltage. For example, the image sensor 100 further includes a multiplexer or multiple switching devices to allow the pulling circuit 12 corresponding to each pixel circuit column to be connected to different pixel circuits 111 via the multiplexer of different switching devices. In the first embodiment, each of the pulling circuits 12 includes a P-type transistor PM0 used to pull up the output voltage after reading out a pulse in the output voltage (illustrated by an example below). A drain of the P-type transistor PM0 is connected to the drain of the second switch transistor NM2. A source of the P-type transistor PM0 is connected to a system voltage VDD, which is identical to or different from the positive bias voltage VA. A gate of the P-type transistor PM0 is used to receive a control signal VB.

The global current source circuit 16 is used to form a current mirror with each of the plurality of pulling circuits 12. The image sensor 100 is arranged with only one global current source circuit 16. For example, the image sensor 100 further includes a multiplexer or multiple switching devices to allow the global current source circuit 16 to be coupled to different pulling circuits 12 via the multiplexer or different switching devices. The global current source circuit 16 includes a P-type transistor whose drain and gate are connected together and connected to a global current source. A source of the P-type transistor is connected to the system voltage VDD.

Each of the plurality of counters 13 is coupled to one pixel circuit column for counting photon events in the output voltage from each pixel circuit 111 of the coupled pixel circuit column.

Figure 2:
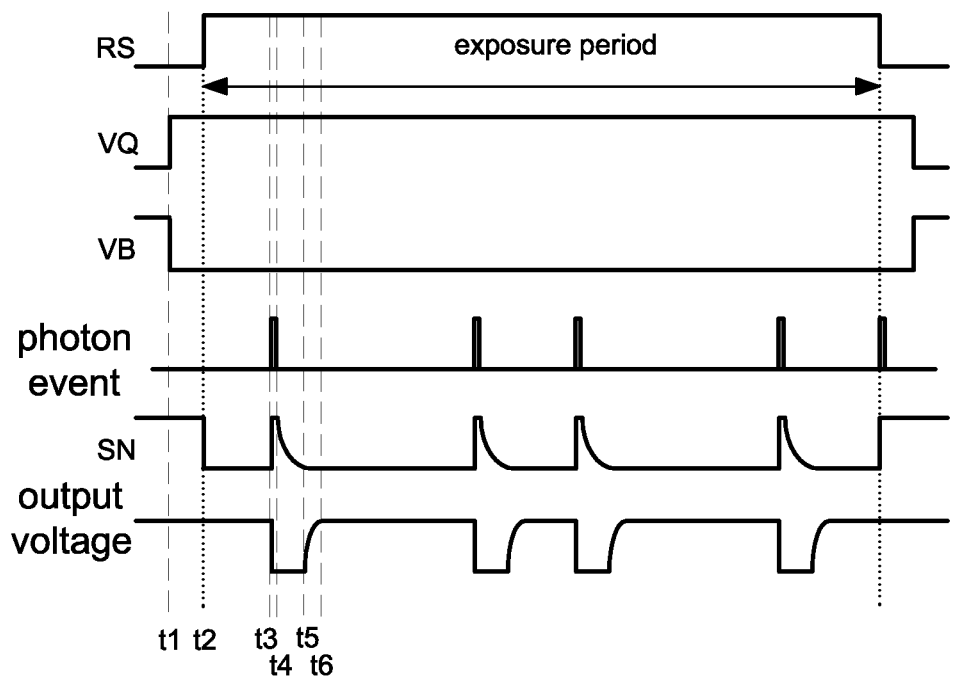
FIG. 2 is an operational timing diagram of an image sensor according to a first embodiment of the present disclosure.
Figure 3:
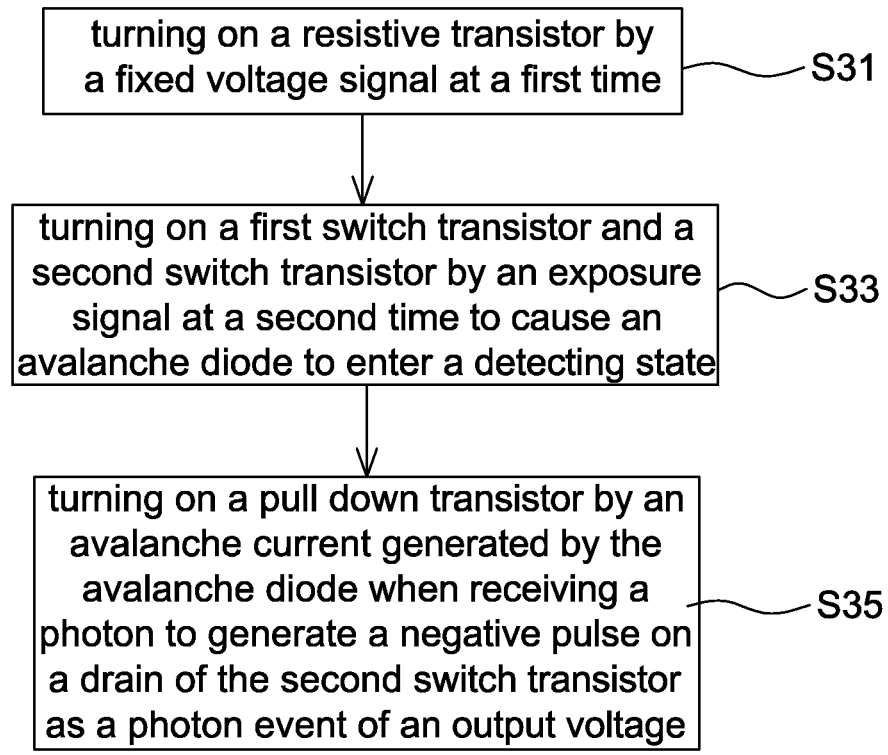
FIG. 3 is a flow chart of an image sensor according to a first embodiment of the present disclosure.

Referring to FIGS. 2 and 3, FIG. 2 is an operational timing diagram of an image sensor 100 according to a first embodiment of the present disclosure; and FIG. 3 is a flow chart of an image sensor 100 according to a first embodiment of the present disclosure. The operating method of the image sensor 100 includes: turning on a resistive transistor by a fixed voltage signal at a first time (Step S31); turning on a first switch transistor and a second switch transistor by an exposure signal at a second time to cause an avalanche diode to enter a detecting state (Step S33); and turning on a pull down transistor by an avalanche current generated by the avalanche diode when receiving a photon to generate a negative pulse on a drain of the second switch transistor as a photon event of an output voltage (Step S35).

Referring to FIGS. 1 to 3 together, details of this operating method are illustrated below. Although this operating method illustrates the operation of one pixel circuit 111, it is appreciated that every pixel circuit 111 in the same pixel circuit column has an operation identical to FIGS. 2 and 3 only occurring at a different time based on the row selection signal.

Step S31: At a first time t1, the fixed voltage signal VQ is switched to a high voltage level to turn on the resistive transistor NM1 of a pixel circuit 111. Meanwhile, as the first switch transistor NM0 is not turned on yet, a voltage drop is not generated on the resistive transistor NM1. At the first time t1, the control signal VB is switched to a low voltage level to turn on the P-type transistor of the pulling circuit 12 (now the pulling circuit 12 being coupled to the corresponding pixel circuit 111 via a switching device or multiplexer).

Step S33: At a second time t2, the exposure signal RS is switched to a high voltage level to turn on the first switch transistor NM0 and the second switch transistor NM2 together. In the first embodiment, a high level interval of the exposure signal RS is referred to an exposure period within which each photon event is counted by the column counter 13. After the first switch transistor NM0 is conducted, as the resistive transistor NM1 has been turned on at the first time t1, a voltage on the node SN is pulled down to a low voltage level. In the first embodiment, the first time t1 is prior to the second time t2 by a predetermined interval as a setting interval of the resistive transistor NM1. In addition, during an interval between the second time t2 and the time t3, although the second switch transistor NM2 is conducted, the output voltage is still kept at a high voltage level because the pull down transistor NM3 is not turned on yet.

Step S35: Within the exposure period, the SPAD is in the detecting state when the avalanche diode SPAD does not receive any photon (e.g., an interval between t2 and t3 in FIG. 2), wherein the voltage on the node SN and the output voltage are respectively kept at a low voltage level and a high voltage level. When the avalanche diode SPAD receives a photon (e.g., at time t3 in FIG. 2), the avalanche diode SPAD generates an avalanche current Ia flowing through the resistive transistor NM1 to form a voltage drop thereon to cause the voltage on the node SN to change to a high voltage level to turn on the pull down transistor NM3. Meanwhile, the drain of the second switch transistor NM2 is connected to the ground via the second switch transistor NM2 and the pull down transistor NM3 to cause the output voltage to generate a negative pulse as a photon event of the output voltage. Meanwhile, as the voltage on the node SN is changed to a high voltage level to cause the voltage difference between the cathode and the anode of the avalanche diode SPAD to be smaller than the breakdown voltage, the quenching is started.

Next, the voltage on the node SN starts to discharge at time t4 via the pull down transistor NM3, and the pull down transistor NM3 is automatically turned off (e.g., at time t5 in FIG. 2) after a discharge interval, and the avalanche diode SPAD returns to a detecting state, wherein said discharge interval is determined according to the resistance of the resistive transistor NM1 and the stray capacitance of the circuit. As mentioned above, said resistance of the resistive transistor NM1 and the stray capacitance are determined in a circuit design stage so as to determine a time interval of the avalanche diode SPAD returning to the detecting state.

Finally, after the pull down transistor NM3 is automatically turned off, the pulling circuit 12 pulls up the output voltage back to a high voltage level to return to an original level at time t6. In this way, one quenching and reading cycle is accomplished.

Figure 6:
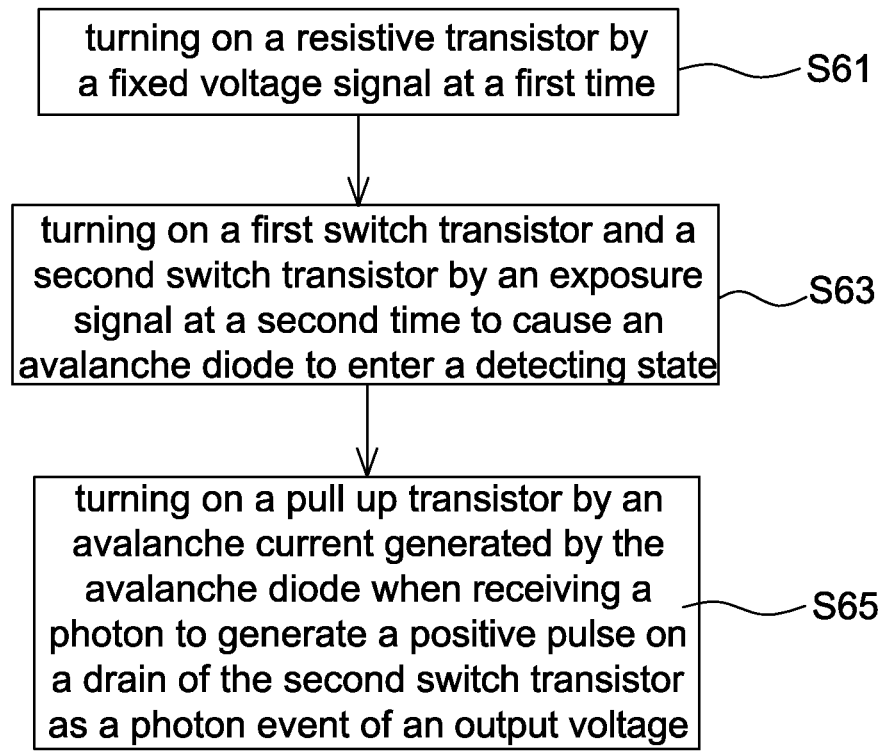
FIG. 6 is a flow chart of an image sensor according to a second embodiment of the present disclosure.

During an exposure period, corresponding to each incident photon, the operation of the pixel circuit 111 repeats the process from the first time t1 to time t6 in FIG. 6. For example, the counter 13 counts four negative pulses as the detection result within the exposure period in FIG. 2.

Figure 4:
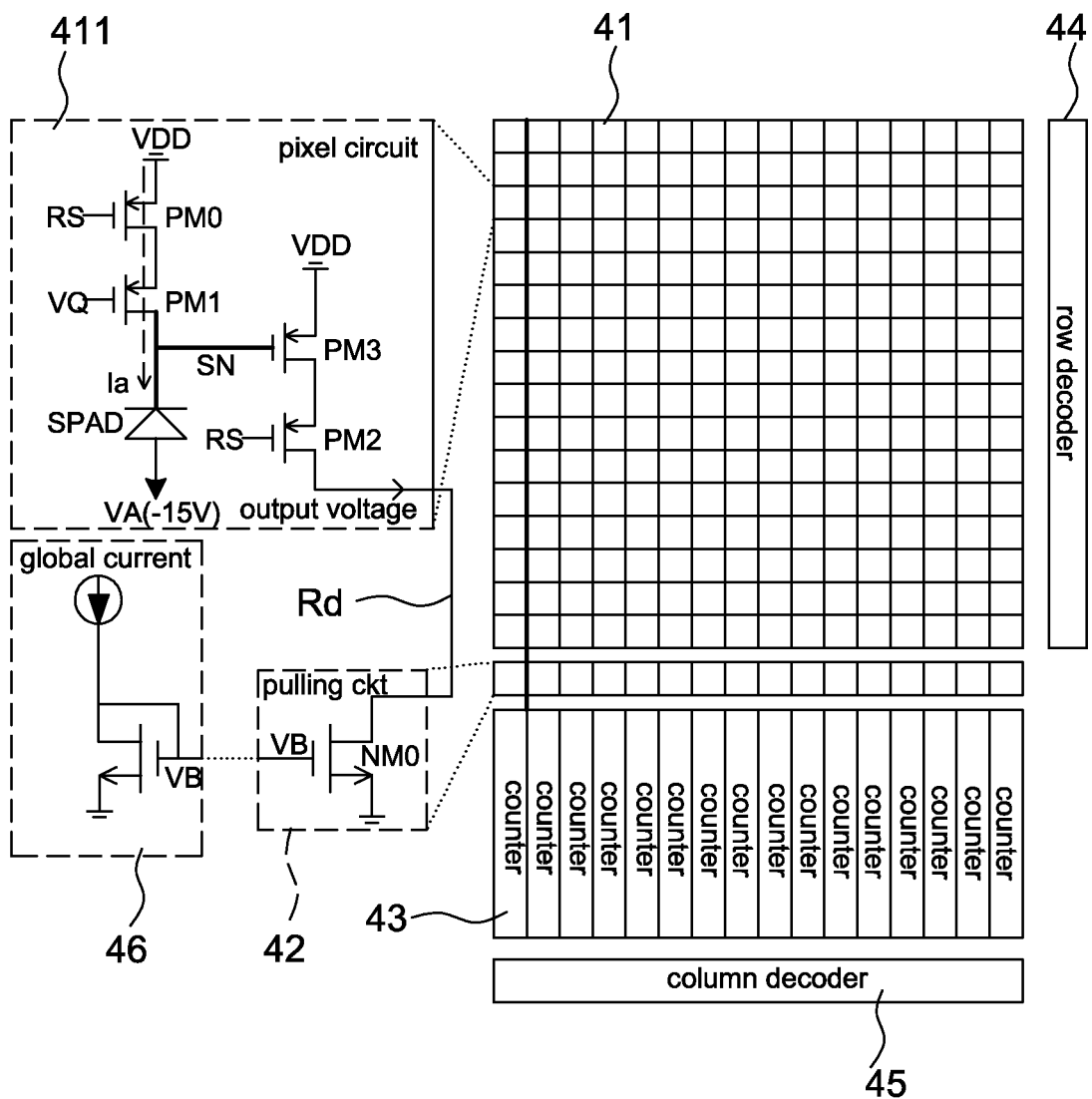
FIG. 4 is a schematic diagram of an image sensor according to a second embodiment of the present disclosure.

Referring to FIG. 4, it is a schematic diagram of an image sensor 400 according to a second embodiment of the present disclosure. The image sensor 400 is also used to detect extremely weak light and high frequency signals, and thus a single photon avalanche diode (SPAD) is employed to detect photon events. A processor generates an image frame by counting photon events of every pixel to perform the object tracking, gesture recognition, 3D image construction, and biological feature detection and recognition.

The image sensor 400 includes a pixel array 41, a plurality of pulling circuits 42, a plurality of counters 43, a row decoder 44, a column decoder 45 and a global current source circuit 46, wherein the row decoder 44 and the column decoder 45 are also used to determine a pixel position in the pixel array 41 that is being exposed and outputting a detected signal (e.g., pulses mentioned below).

The pixel array 41 includes a plurality of pixel circuits 411 (e.g., FIG. 4 also showing 16×16 pixels as an example) arranged in a matrix. Each of the plurality of pixel circuits 411 has an avalanche diode SPAD and four P-type transistors including a resistive transistor PM1, a first switch transistor PM0, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a node SN. When a voltage difference (or bias) between the cathode and the anode exceeds a breakdown voltage of the avalanche diode SPAD, an avalanche current Ia is generated. In the second embodiment, the resistive transistor PM1 and the first switch transistor PM0 of the pixel circuit 411 are used to form a quenching circuit, which causes the voltage difference between the cathode and the anode to be lower than the breakdown voltage for quenching when the avalanche diode SPAD generates the avalanche current Ia. The pull up transistor PM3 and the second switch transistor PM2 of the pixel circuit 411 are used to form a readout circuit, which reads an output voltage of the pixel circuit 411 to a corresponding column counter 43.

A drain of the resistive transistor PM1 is connected to the node SN to connect to the cathode of the avalanche diode SPAD. A gate of the resistive transistor PM1 is used to receive a fixed voltage signal VQ and be turned on or off thereby. In the second embodiment, the resistive transistor PM1 is used to form a controllable resistor, and resistance of the controllable resistor is determined according to a voltage value of the fixed voltage signal VQ. When the avalanche diode SPAD receives a photon in the detecting state and the first switch transistor PM0 is conducted, a voltage drop is formed on the resistive transistor PM1 to cause the voltage difference between the cathode and the anode of the avalanche diode SPAD to be lower than the breakdown voltage for the quenching.

A drain of the first switch transistor PM0 is connected to a source of the resistive transistor PM1. A gate of the first switch transistor PM0 is used to receive an exposure signal RS, which is a row selection signal and, for example, generated by the row decoder 44. A source of the first switch transistor PM0 is connected to a system voltage VDD.

A gate of the pull up transistor PM3 is connected to the node SN to connect to the cathode of the avalanche diode SPAD. A source of the pull up transistor PM3 is connected to the system voltage VDD. The pull up transistor PM3 is used as a charging path of a voltage on the node SN, and a charging speed is determined according to resistance of the resistive transistor PM1 and stray capacitance of the circuit. The resistance and the stray capacitance are values determined in circuit manufacturing.

A gate of the second switch transistor PM2 also receives the exposure signal RS, and controlled by the exposure signal RS to be turned on or off together with the first switch transistor PM0. A source of the second switch transistor PM2 is connected to a drain of the pull up transistor PM3. A drain of the second switch transistor PM2 is used to generate an output voltage of the associated pixel circuit 411.

Each of the plurality of pulling circuits 42 is used to connect to the drain of the second switch transistor PM2 of each pixel circuit 411 in one pixel circuit column via a readout line Rd for reading the output voltage. For example, the image sensor 400 further includes a multiplexer or multiple switching devices to allow the pulling circuit 42 corresponding to each pixel circuit column to be connected to different pixel circuits 411 via the multiplexer of different switching devices. In the second embodiment, each of the pulling circuits 42 includes an N-type transistor NM0 used to pull down the output voltage after reading out a pulse in the output voltage (illustrated by an example below). A drain of the N-type transistor NM0 is connected to the drain of the second switch transistor PM2. A source of the N-type transistor NM0 is connected to a ground voltage. A gate of the N-type transistor NM0 is used to receive a control signal VB.

The global current source circuit 46 is used to form a current mirror with each of the plurality of pulling circuits 42. The image sensor 400 is arranged with only one global current source circuit 46. For example, the image sensor 400 further includes a multiplexer or multiple switching devices to allow the global current source circuit 46 to be coupled to different pulling circuits 42 via the multiplexer or different switching devices. The global current source circuit 46 includes an N-type transistor whose drain and gate are connected together and connected to a global current source. A source of the N-type transistor is connected to the ground voltage.

Each of the plurality of counters 43 is coupled to one pixel circuit column for counting photon events in the output voltage from each pixel circuit 411 of the coupled pixel circuit column.

Figure 5:
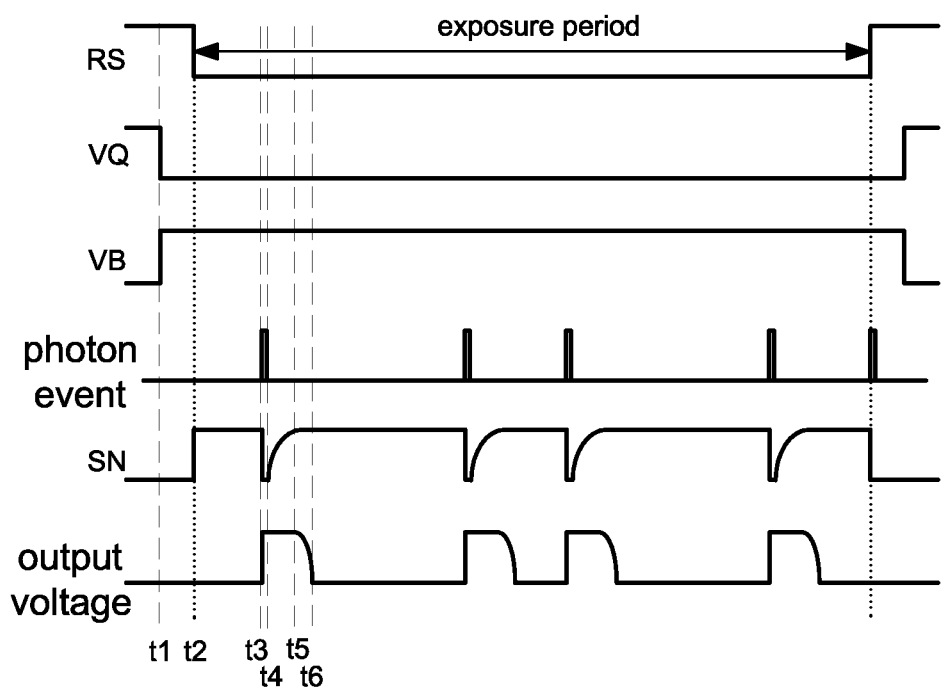
FIG. 5 is an operational timing diagram of an image sensor according to a second embodiment of the present disclosure.

Referring to FIGS. 5 and 6, FIG. 5 is an operational timing diagram of an image sensor 400 according to a second embodiment of the present disclosure; and FIG. 6 is a flow chart of an image sensor 400 according to a second embodiment of the present disclosure. The operating method of the image sensor 400 includes: turning on a resistive transistor by a fixed voltage signal at a first time (Step S61); turning on a first switch transistor and a second switch transistor by an exposure signal at a second time to cause an avalanche diode to enter a detecting state (Step S63); and turning on a pull up transistor by an avalanche current generated by the avalanche diode when receiving a photon to generate a positive pulse on a drain of the second switch transistor as a photon event of an output voltage (Step S65).

Referring to FIGS. 4 to 6 together, details of this operating method are illustrated below. Although this operating method illustrates the operation of one pixel circuit 411, it is appreciated that every pixel circuit 411 in the same pixel circuit column has an operation identical to FIGS. 5 and 6 only occurring at a different time based on the row selection signal.

Step S61: At a first time t1, the fixed voltage signal VQ is switched to a low voltage level to turn on the resistive transistor PM1 of a pixel circuit 411. Meanwhile, as the first switch transistor PM0 is not turned on yet, a voltage drop is not generated on the resistive transistor PM1. At the first time t1, the control signal VB is switched to a high voltage level to turn on the N-type transistor of the pulling circuit 42 (now the pulling circuit 42 being coupled to the corresponding pixel circuit 411 via a switching device or multiplexer).

Step S63: At a second time t2, the exposure signal RS is switched to a low voltage level to turn on the first switch transistor PM0 and the second switch transistor PM2 together. In the second embodiment, a low level interval of the exposure signal RS is referred to an exposure period within which each photon event is counted by the column counter 43. After the first switch transistor PM0 is conducted, as the resistive transistor PM1 has been turned on at the first time t1, a voltage on the node SN is pulled up to a high voltage level. In the second embodiment, the first time t1 is prior to the second time t2 by a predetermined interval as a setting interval of the resistive transistor PM1. In addition, during an interval between the second time t2 and the time t3, although the second switch transistor PM2 is conducted, the output voltage is still kept at a low voltage level because the pull up transistor PM3 is not turned on yet.

Step S65: Within the exposure period, the SPAD is in the detecting state when the avalanche diode SPAD does not receive any photon (e.g., an interval between t2 and t3 in FIG. 5), wherein the voltage on the node SN and the output voltage are respectively kept at a high voltage level and a low voltage level. When the avalanche diode SPAD receives a photon (e.g., at time t3 in FIG. 5), the avalanche diode SPAD generates an avalanche current Ia flowing through the resistive transistor PM1 to form a voltage drop thereon to cause the voltage on the node SN to change to a low voltage level to turn on the pull up transistor PM3. Meanwhile, the drain of the second switch transistor NM2 is connected to the system voltage VDD via the second switch transistor PM2 and the pull up transistor PM3 to cause the output voltage to generate a positive pulse as a photon event of the output voltage. Meanwhile, as the voltage on the node SN is changed to a low voltage level to cause the voltage difference between the cathode and the anode of the avalanche diode SPAD to be smaller than the breakdown voltage, the quenching is started.

Next, the voltage on the node SN starts to be charged at time t4 via the pull up transistor PM3, and the pull up transistor PM3 is automatically turned off (e.g., at time t5 in FIG. 5) after a charge interval, and the avalanche diode SPAD returns to a detecting state, wherein said charge interval is determined according to the resistance of the resistive transistor PM1 and the stray capacitance of the circuit. As mentioned above, said resistance of the resistive transistor PM1 and the stray capacitance are determined in a circuit design stage so as to determine a time interval of the avalanche diode SPAD returning to the detecting state.

Finally, after the pull up transistor PM3 is automatically turned off, the pulling circuit 42 pulls down the output voltage back to a low voltage level to return to an original level at time t6. In this way, one quenching and reading cycle is accomplished.

During an exposure period, corresponding to each incident photon, the operation of the pixel circuit 411 repeats the process from the first time t1 to time t6 in FIG. 6. For example, the counter 43 counts four positive pulses as the detection result within the exposure period in FIG. 5.

Figure 7:
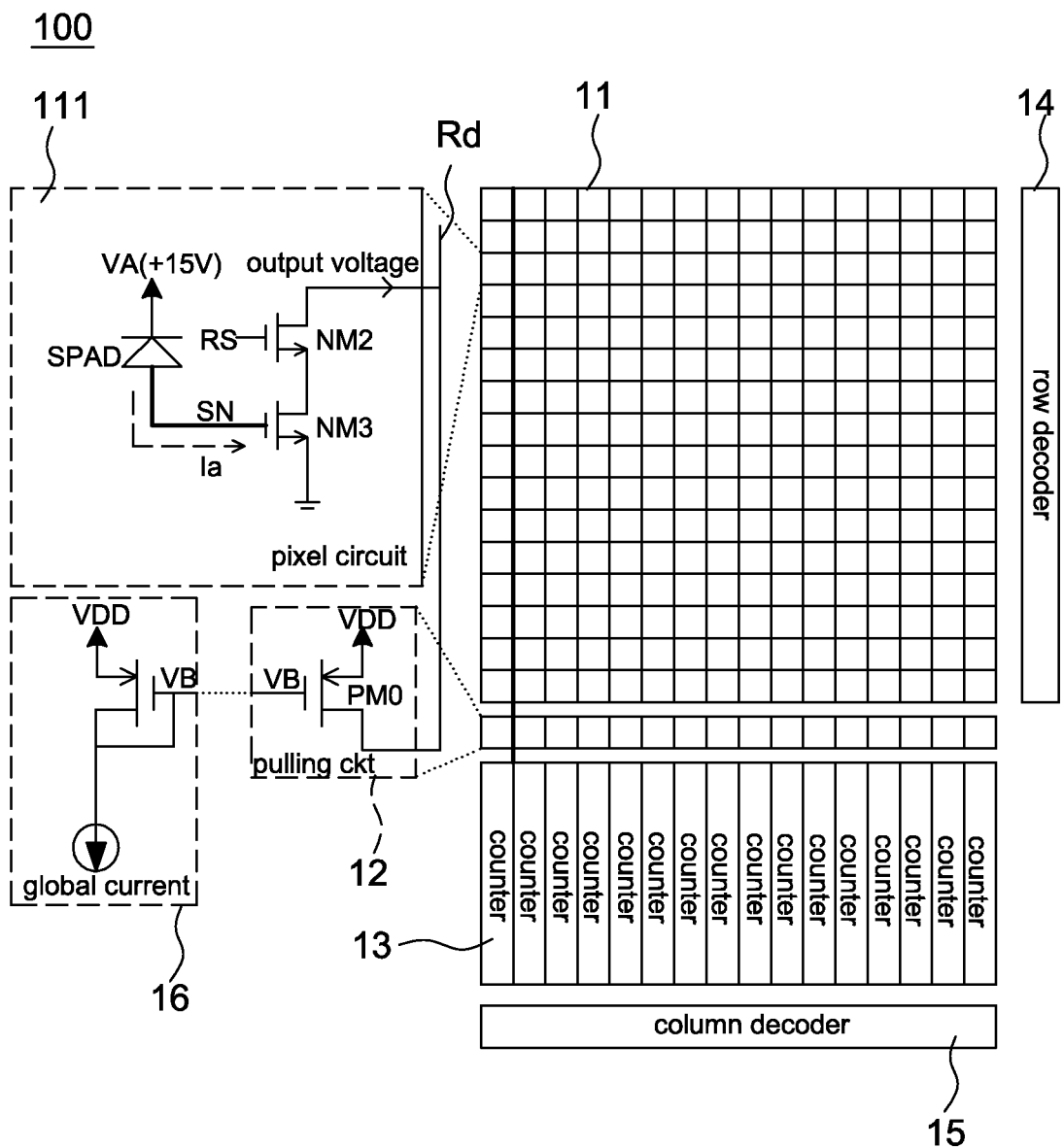
FIG. 7 is a schematic diagram of an image sensor according to a third embodiment of the present disclosure.
Figure 8:
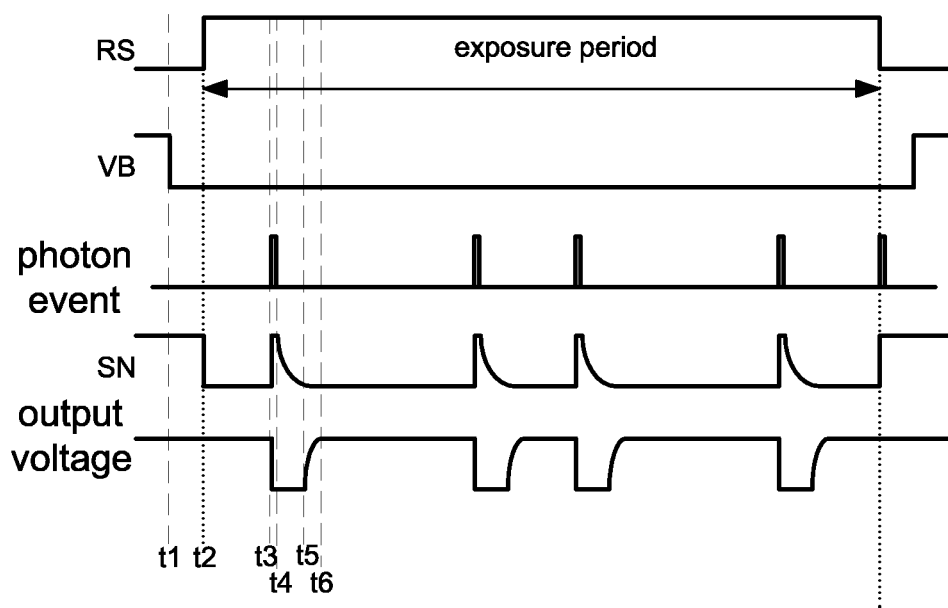
FIG. 8 is an operational timing diagram of an image sensor according to a third embodiment of the present disclosure.

Although the first and second embodiments mentioned above are described in the way that each pixel circuit includes four transistors, the present disclosure is not limited thereto. Referring to FIGS. 7 and 8, FIG. 7 is a schematic diagram of an image sensor 100 according to a third embodiment of the present disclosure; and FIG. 8 is an operational timing diagram of an image sensor 100 according to a third embodiment of the present disclosure.

In the third embodiment, the image sensor 100 also includes a pixel array 11, a plurality of pulling circuits 12, a plurality of counters 13, a row decoder 14, a column decoder 15 and a global current source circuit 16. The pixel array 11 also includes a plurality of pixel circuits 111.

Each pixel circuit 111 includes an avalanche diode SPAD and at least a transistor NM3. A cathode of SPAD is connected to a positive bias voltage VA, e.g., +15V, but not limited to. An anode of SPAD is connected to a node SN that connects to a gate of the transistor NM3. Each of the plurality of pulling circuits 12 is configured to be coupled to a drain of the transistor NM3 of each pixel circuit 111 of one pixel circuit column via a readout line Rd.

Furthermore, to control the pixel circuit 111 in one pixel circuit column to detect a photo event sequentially, each pixel circuit 111 further includes another transistor NM2 connected between the transistor NM3 and the readout line Rd. Operations of the image sensor 100 is shown in FIG. 8 and similar to that of the first embodiment, only without the transistors NM1 and NM0, and thus details thereof are not repeated herein. Functions of the plurality of pulling circuits 12, the plurality of counters 13, the row decoder 14, the column decoder 15 and the global current source circuit 16 are identical to those of the first embodiment.

It is appreciated that numbers mentioned in the above embodiment, such as the pixel number and pulse number are only intended to illustrate but not to limit the present disclosure.

In addition, the high and low voltage levels mentioned in the above embodiments are selected properly without particular limitations as long as every element operates normally. Meanwhile, the fixed voltage value VQ is referred to a voltage value thereof is maintained constant during the exposure period.

The present disclosure further provides other embodiments of an image sensor having high fill factor, wherein multiple pixel circuits at adjacent rows in each column share the same output circuit (including the above resistive transistor, the second switch transistor and the pull up/down transistor) in order to further increase the fill factor.

To simplify the descriptions, elements below identical to the above embodiments are indicated by identical reference numerals.

Figure 9:
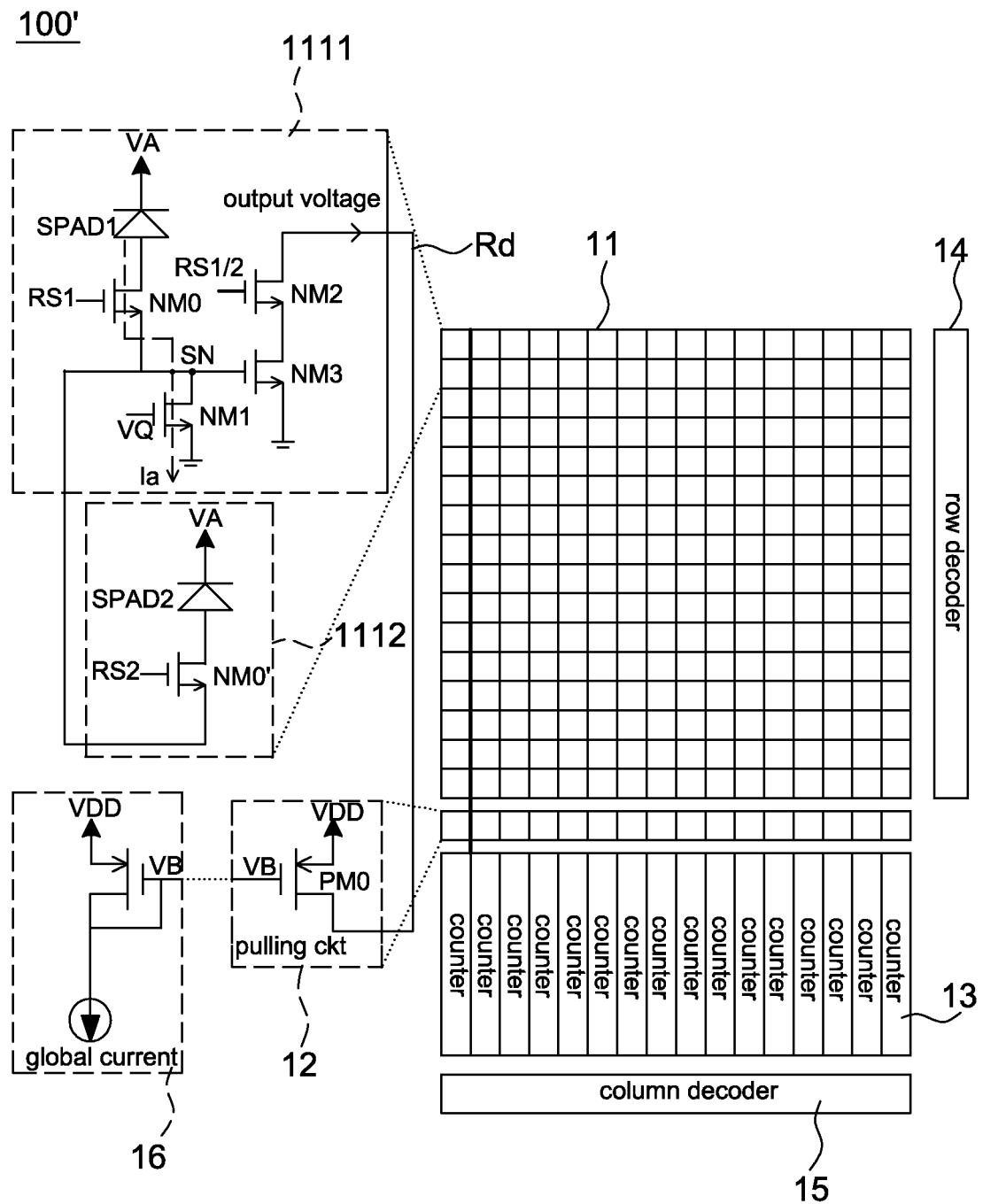
FIG. 9 is a schematic diagram of an image sensor according to a fourth embodiment of the present disclosure.

Please referring to FIG. 9, it is a schematic diagram of an image sensor 100' according to a fourth embodiment of the present disclosure. FIG. 9 shows that two pixel circuits at adjacent rows (called pixel circuit group herein) in each column of the pixel array 11 shares one output circuit, but the sharing of the present disclosure is not limited to two pixel circuit rows. In FIG. 9, the pulling circuits 12, the counters 13, the row decoder 14, the column decoder 15 and the global current source circuit 16 are identical to those shown in FIG. 1 and have been described above, and thus details thereof are not repeated herein.

The transistors in the pixel circuits of the fourth embodiment are N-type transistors as shown in FIG. 9.

Each column of the pixel array 11 includes multiple pixel circuit groups, and each pixel circuit group (e.g., 1111 and 1112 shown in FIG. 9) includes a first avalanche photodiode SPAD1, a first switch transistor NM0, a resistive transistor NM1, a second switch transistor NM2, a pull down transistor NM3, a second avalanche photodiode SPAD2 and a third switch transistor NM0'. The SPAD1 and the first switch transistor NM0 are arranged in a first pixel circuit 1111, and the SPAD2 and the third switch transistor NM0' are arranged in a second pixel circuit 1112, wherein the first pixel circuit 1111 and the second pixel circuit 1112 are adjacent to each other. The resistive transistor NM1, the second switch transistor NM2 and the pull down transistor NM3 form an output circuit that is arranged inside the first pixel circuit 1111, inside the second pixel circuit 1112 or between or outside the first pixel circuit 1111 and the second pixel circuit 1112 without particular limitations.

The first avalanche diode SPAD1 has an anode and a cathode, and the cathode thereof is connected to a positive bias voltage VA. A drain of the first switch transistor NM0 is connected to the anode of the SPAD1, a gate of the first switch transistor NM0 is used to receive a first exposure signal RS1, and a source of the first switch transistor NM0 is connected to a node SN.

The second avalanche diode SPAD2 has an anode and a cathode, and the cathode thereof is connected to the positive bias voltage VA. A drain of the third switch transistor NM0' is connected to the anode of the SPAD2, a gate of the third switch transistor NM0' is used to receive a second exposure signal RS2, and a source of the third switch transistor NM0' is connected to the node SN.

A drain of the resistive transistor NM1 is connected to the node SN, a gate of the resistive transistor NM1 is used to receive a fixed voltage signal VQ, and a source of the resistive transistor NM1 is connected to a ground voltage. A gate of the pull down transistor NM3 is connected to the node SN, and a source of the pull down transistor NM3 is connected to the ground voltage. A gate of the second switch transistor NM2 is used to receive the first exposure signal RS1 or the second exposure signal RS2 (e.g., corresponding to the exposure period of different rows), a source of the second switch transistor NM2 is connected to a drain of the pull down transistor NM3, and a drain of the second switch transistor NM2 is used to generate a first output voltage or a second output voltage (e.g., corresponding to the exposure period of different rows).

Each of the plurality of pulling circuits 12 is used to be coupled to the drain of the second switch transistor NM2 of each pixel circuit group of one column of pixel circuit groups via a readout line Rd to read the first output voltage or the second output voltage.

In this embodiment, the first exposure signal RS1 and the second exposure signal RS2 are row selection signals (e.g., generated by the row decoder 14) to sequentially activate an exposure period. For example, the first exposure signal RS1 is used to activate a first pixel circuit row and the second exposure signal RS2 is used to activate a second pixel circuit row.

During an interval that the first exposure signal RS1 activates the first pixel circuit row, operations of the SPAD1 and the first switch transistor NM0 of the first pixel circuit 1111 as well as the resistive transistor NM1, the second switch transistor NM2 and the pull down transistor NM3 of the output circuit are identical to FIG. 1 and based on the signal timing diagram of FIG. 2, and the output signal generated within this interval is referred to a first output voltage.

During an interval that the second exposure signal RS2 activates the second pixel circuit row, operations of the SPAD2 (replacing the SPAD1 in descriptions of FIG. 2) and the third switch transistor NM0' (replacing the NM0 in descriptions of FIG. 2) of the second pixel circuit 1112 as well as the resistive transistor NM1, the second switch transistor NM2 and the pull down transistor NM3 of the output circuit are identical to FIG. 1 and based on the signal timing diagram of FIG. 2, and the output signal generated within this interval is referred to a second output voltage.

The structure and operation of every pixel circuit group of each pixel circuit column are identical to 1111 and 1112.

In an aspect that one pixel circuit group includes three or more than three pixel circuits, each pixel circuit includes an avalanche diode and a first switch transistor, and multiple pixel circuits shares the same output circuit. The output circuit is arranged in one of the multiple pixel circuits or outside the multiple pixel circuits.

Figure 10:
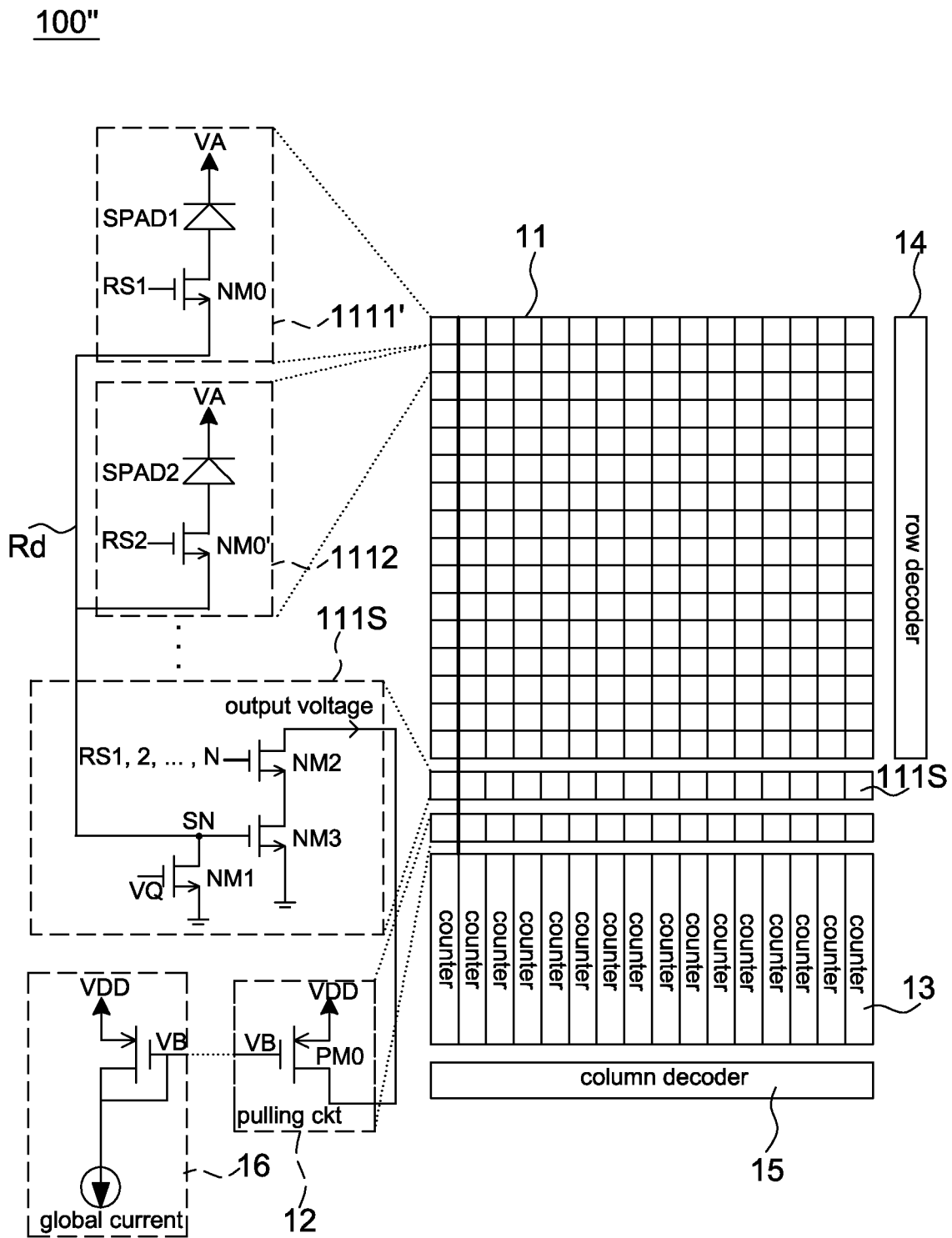
FIG. 10 is a schematic diagram of an image sensor according to a fifth embodiment of the present disclosure.

For example referring to FIG. 10, it is a schematic diagram of an image sensor 100" according to a fifth embodiment of the present disclosure. In the fifth embodiment, the pixel array 11 includes a plurality of pixel circuits (e.g., shown as 1111' and 1112) arranged in a matrix, and each of a plurality of output circuits 111S is coupled to one pixel circuit column via a readout line Rd and coupled to one pulling circuit 12 and one counter 13.

In FIG. 10, the pulling circuits 12, the counters 13, the row decoder 14, the column decoder 15 and the global current source circuit 16 are identical to those shown in FIG. 1 and have been described above, and thus details thereof are not repeated herein.

The transistors in the pixel circuits in the fifth embodiment are N-type transistors as shown in FIG. 10.

Each of the plurality of pixel circuits includes an avalanche diode and a select switch transistor (functioning identical to the first switch transistor in FIG. 1). For example, the first pixel circuit 1111' includes an avalanche diode SPAD1 and a select switch transistor NM0; and the second pixel circuit 1112 includes an avalanche diode SPAD2 and a select switch transistor NM0'; and so on.

The avalanche diodes SPAD1 and SPAD2 respectively have an anode and a cathode, and the cathode thereof is connected to a positive bias voltage VA. Drains of the select switch transistors NM0 and NM0' are respectively connected to the anodes of the avalanche diodes SPAD1 and SPAD2, gates of the select switch transistors NM0 and NM0' are respectively used to receive an exposure signal RS1 and RS2, and sources of the select switch transistors NM0 and NM0' are connected to a node SN via a readout line Rd. In one aspect, the readout line Rd within the pixel array 11 is used to transmit a voltage on the node SN to a corresponding output circuit 111S rather than transmitting the output voltage.

The plurality of output circuits 111S is selected to be arranged outside the pixel array 11, e.g., between the pixel array 11 and the pulling circuits 12. Each of the plurality of output circuits 111S includes a resistive transistor NM1, a pull down transistor NM3 and a second switch transistor NM2.

A drain of the resistive transistor NM1 is connected to the node SN, a gate of the resistive transistor NM1 is used to receive a fixed voltage signal VQ, and a source of the resistive transistor NM1 is connected to a ground voltage. A gate of the pull down transistor NM3 is connected to the node SN, and a source of the pull down transistor NM3 is connected to the ground voltage. A gate of the second switch transistor NM2 is used to sequentially (e.g., corresponding to exposure periods of different pixel circuit rows) receive an exposure signal RS1, RS2 . . . RSN (e.g., N being a number of rows of the pixel array 11), a source of the second switch transistor NM2 is connected to a drain of the pull down transistor NM3, and a drain of the second switch transistor NM2 is used to sequentially generate an output voltage corresponding to exposure periods of different pixel circuit rows.

Each of a plurality of pulling circuits 12 is used to be coupled to the drain of the second switch transistor NM2 of one of the plurality of output circuits 111S to sequentially read the output voltage corresponding to exposure periods of different pixel circuit rows.

In this embodiment, the exposure signals RS1, RS2 . . . RSN are row selection signals (e.g., generated by the row decoder 14) to sequentially activate an exposure period corresponding different pixel circuit rows. For example, the first exposure signal RS1 is used to activate a first pixel circuit row; the second exposure signal RS2 is used to activate a second pixel circuit row; . . . ; and the exposure signal RSN is used to activate a last pixel circuit row.

During the first exposure signal RS1 activating the first pixel circuit row, operations of the SPAD1 and the select switch transistor NM0 of the first pixel circuit 1111' as well as the resistive transistor NM1, the second switch transistor NM2 and the pull down transistor NM3 of the output circuit 111S are identical to FIG. 1 and based on the signal timing diagram of FIG. 2. Within the exposure period of the first pixel circuit row, the output signal generated by the output circuit 111S is referred to a first output voltage.

During the second exposure signal RS2 activating the second pixel circuit row, operations of the SPAD2 (replacing the SPAD1 in descriptions of FIG. 2) and the select switch transistor NM0' (replacing the NM0 in descriptions of FIG. 2) of the second pixel circuit 1112 as well as the resistive transistor NM1, the second switch transistor NM2 and the pull down transistor NM3 of the output circuit 111S are identical to FIG. 1 and based on the signal timing diagram of FIG. 2. Within the exposure period of the second pixel circuit row, the output signal generated by the output circuit 111S is referred to a second output voltage.

The operations of other pixel circuits are similar to the above first and second pixel circuits 1111' and 1112, and thus are not repeated herein.

More specifically, the operation of every pixel circuit at each pixel circuit column is performed by the avalanche diode and the select switch transistor thereof in conjunction with the resistive transistor NM1, the second switch transistor NM2 and the pull down transistor NM3 of the output circuit 111S. Each output circuit 111S generates an output voltage within the exposure period of each pixel circuit for the corresponding counter 13 to count photon events.

Each of the pulling circuits 12 is used to pull up the first output voltage or the second output voltage after a photon event of the first output voltage or the second output voltage is read.

Figure 11:
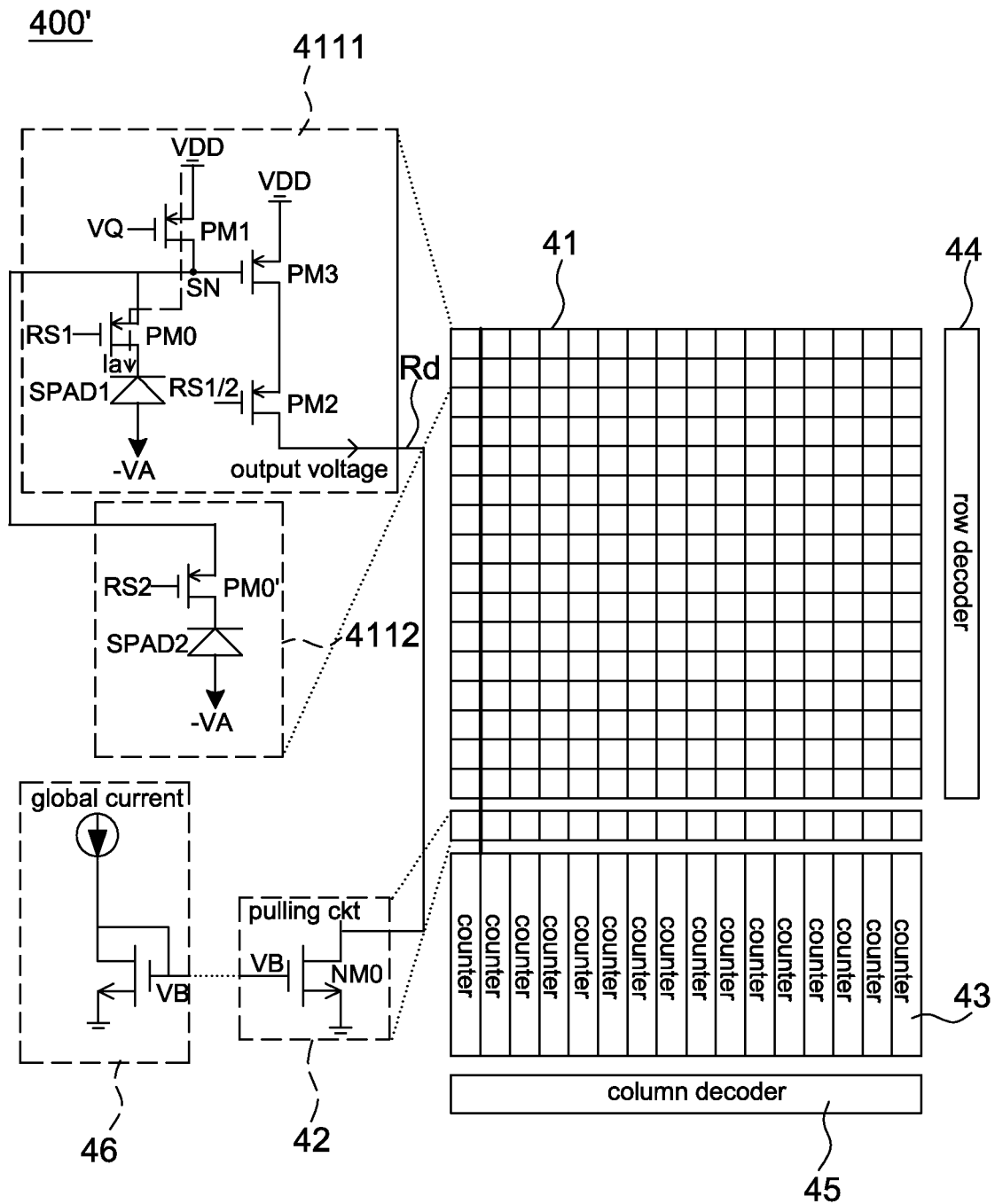
FIG. 11 is a schematic diagram of an image sensor according to a sixth embodiment of the present disclosure.

Please referring to FIG. 11, it is a schematic diagram of an image sensor 400' according to a sixth embodiment of the present disclosure. FIG. 11 shows that two pixel circuits at adjacent rows (called pixel circuit group herein) in each column of the pixel array 41 shares one output circuit, but the sharing of the present disclosure is not limited to two pixel circuit rows. In FIG. 11, the pulling circuits 42, the counters 43, the row decoder 44, the column decoder 45 and the global current source circuit 46 are identical to those shown in FIG. 4 and have been described above, and thus details thereof are not repeated herein.

The transistors in the pixel circuits of the sixth embodiment are P-type transistors as shown in FIG. 11.

Each column of the pixel array 41 includes multiple pixel circuit groups, and each pixel circuit group (e.g., 4111 and 4112 shown in FIG. 11) includes a first avalanche photodiode SPAD1, a first switch transistor PM0, a resistive transistor PM1, a second switch transistor PM2, a pull up transistor PM3, a second avalanche photodiode SPAD2 and a third switch transistor PM0'. The SPAD1 and the first switch transistor PM0 are arranged in a first pixel circuit 4111, and the SPAD2 and the third switch transistor PM0' are arranged in a second pixel circuit 4112, wherein the first pixel circuit 4111 and the second pixel circuit 4112 are adjacent to each other. The resistive transistor PM1, the second switch transistor PM2 and the pull up transistor PM3 form an output circuit that is arranged inside the first pixel circuit 4111, inside the second pixel circuit 4111 or between or outside the first pixel circuit 4111 and the second pixel circuit 4112 without particular limitations.

The first avalanche diode SPAD1 has an anode and a cathode, and the anode thereof is connected to a negative bias voltage −VA. A drain of the first switch transistor PM0 is connected to the cathode of the SPAD1, a gate of the first switch transistor PM0 is used to receive a first exposure signal RS1, and a source of the first switch transistor PM0 is connected to a node SN.

The second avalanche diode SPAD2 has an anode and a cathode, and the anode thereof is connected to the negative bias voltage −VA. A drain of the third switch transistor PM0' is connected to the cathode of the SPAD2, a gate of the third switch transistor PM0' is used to receive a second exposure signal RS2, and a source of the third switch transistor PM0' is connected to the node SN.

A drain of the resistive transistor PM1 is connected to the node SN, a gate of the resistive transistor PM1 is used to receive a fixed voltage signal VQ, and a source of the resistive transistor PM1 is connected to a system voltage VDD. A gate of the pull up transistor PM3 is connected to the node SN, and a source of the pull up transistor PM3 is connected to the system voltage VDD. A gate of the second switch transistor PM2 is used to receive the first exposure signal RS1 or the second exposure signal RS2 (e.g., corresponding to the exposure period of different rows), a source of the second switch transistor PM2 is connected to a drain of the pull up transistor PM3, and a drain of the second switch transistor PM2 is used to generate a first output voltage or a second output voltage (e.g., corresponding to the exposure period of different rows).

Each of the plurality of pulling circuits 42 is used to be coupled to the drain of the second switch transistor PM2 of each pixel circuit group of one column of pixel circuit groups via a readout line Rd to read the first output voltage or the second output voltage.

In this embodiment, the first exposure signal RS1 and the second exposure signal RS2 are row selection signals (e.g., generated by the row decoder 44) to sequentially activate an exposure period. For example, the first exposure signal RS1 is used to activate a first pixel circuit row and the second exposure signal RS2 is used to activate a second pixel circuit row.

During an interval that the first exposure signal RS1 activates the first pixel circuit row, operations of the SPAD1 and the first switch transistor PM0 of the first pixel circuit 4111 as well as the resistive transistor PM1, the second switch transistor PM2 and the pull up transistor PM3 of the output circuit are identical to FIG. 4 and based on the signal timing diagram of FIG. 5, and the output signal generated within this interval is referred to a first output voltage.

During an interval that the second exposure signal RS2 activates the second pixel circuit row, operations of the SPAD2 (replacing the SPAD1 in descriptions of FIG. 5) and the third switch transistor PM0' (replacing the NM0 in descriptions of FIG. 5) of the second pixel circuit 4112 as well as the resistive transistor PM1, the second switch transistor PM2 and the pull up transistor PM3 of the output circuit are identical to FIG. 4 and based on the signal timing diagram of FIG. 5, and the output signal generated within this interval is referred to a second output voltage.

The structure and operation of every pixel circuit group of each pixel circuit column are identical to 4111 and 4112.

In an aspect that one pixel circuit group includes three or more than three pixel circuits, each pixel circuit includes an avalanche diode and a first switch transistor, and multiple pixel circuits shares the same output circuit. The output circuit is arranged in one of the multiple pixel circuits or outside the multiple pixel circuits.

Figure 12:
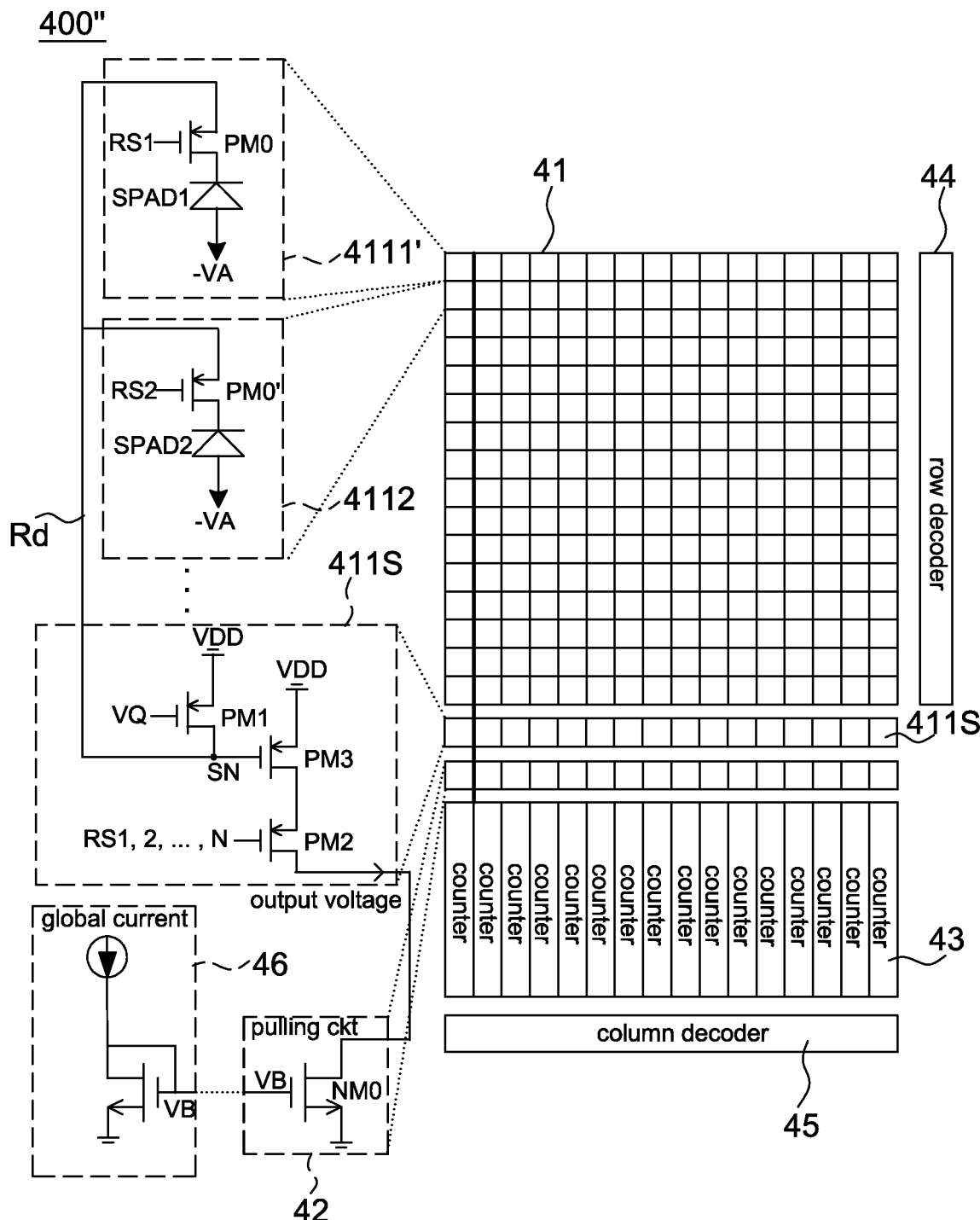
FIG. 12 is a schematic diagram of an image sensor according to a seventh embodiment of the present disclosure.

For example referring to FIG. 12, it is a schematic diagram of an image sensor 400" according to a seventh embodiment of the present disclosure. In the seventh embodiment, the pixel array 41 includes a plurality of pixel circuits (e.g., shown as 4111' and 4112) arranged in a matrix, and each of a plurality of output circuits 411S is coupled to one pixel circuit column via a readout line Rd and coupled to one pulling circuit 42 and one counter 43.

In FIG. 12, the pulling circuits 42, the counters 43, the row decoder 44, the column decoder 45 and the global current source circuit 46 are identical to those shown in FIG. 4 and have been described above, and thus details thereof are not repeated herein.

The transistors in the pixel circuits in the seventh embodiment are P-type transistors as shown in FIG. 12.

Each of the plurality of pixel circuits includes an avalanche diode and a select switch transistor (functioning identical to the first switch transistor in FIG. 4). For example, the first pixel circuit 4111' includes an avalanche diode SPAD1 and a select switch transistor PM0; and the second pixel circuit 4112 includes an avalanche diode SPAD2 and a select switch transistor PM0'; and so on.

The avalanche diodes SPAD1 and SPAD2 respectively have an anode and a cathode, and the anode thereof is connected to a negative bias voltage −VA. Drains of the select switch transistors PM0 and PM0' are respectively connected to the cathodes of the avalanche diodes SPAD1 and SPAD2, gates of the select switch transistors NM0 and NM0' are respectively used to receive an exposure signal RS1 and RS2, and sources of the select switch transistors NM0 and NM0' are connected to a node SN via a readout line Rd. In one aspect, the readout line Rd within the pixel array 41 is used to transmit a voltage on the node SN to a corresponding output circuit 411S rather than transmitting the output voltage.

The plurality of output circuits 411S is selected to be arranged outside the pixel array 41, e.g., between the pixel array 41 and the pulling circuits 42. Each of the plurality of output circuits 411S includes a resistive transistor PM1, a pull up transistor PM3 and a second switch transistor PM2.

A drain of the resistive transistor PM1 is connected to the node SN, a gate of the resistive transistor PM1 is used to receive a fixed voltage signal VQ, and a source of the resistive transistor PM1 is connected to a system voltage VDD. A gate of the pull up transistor PM3 is connected to the node SN, and a source of the pull up transistor PM3 is connected to the system voltage VDD. A gate of the second switch transistor PM2 is used to sequentially (e.g., corresponding to exposure periods of different pixel circuit rows) receive an exposure signal RS1, RS2 . . . RSN (e.g., N being a number of rows of the pixel array 41), a source of the second switch transistor PM2 is connected to a drain of the pull up transistor PM3, and a drain of the second switch transistor PM2 is used to sequentially generate an output voltage corresponding to exposure periods of different pixel circuit rows.

Each of a plurality of pulling circuits 42 is used to be coupled to the drain of the second switch transistor PM2 of one of the plurality of output circuits 411S to sequentially read the output voltage corresponding to exposure periods of different pixel circuit rows.

In this embodiment, the exposure signals RS1, RS2 . . . RSN are row selection signals (e.g., generated by the row decoder 44) to sequentially activate an exposure period corresponding different pixel circuit rows. For example, the first exposure signal RS1 is used to activate a first pixel circuit row; the second exposure signal RS2 is used to activate a second pixel circuit row; . . . ; and the exposure signal RSN is used to activate a last pixel circuit row.

During the first exposure signal RS1 activating the first pixel circuit row, operations of the SPAD1 and the select switch transistor PM0 of the first pixel circuit 4111' as well as the resistive transistor PM1, the second switch transistor PM2 and the pull up transistor PM3 of the output circuit 411S are identical to FIG. 4 and based on the signal timing diagram of FIG. 5. Within the exposure period of the first pixel circuit row, the output signal generated by the output circuit 411S is referred to a first output voltage.

During the second exposure signal RS2 activating the second pixel circuit row, operations of the SPAD2 (replacing the SPAD1 in descriptions of FIG. 5) and the select switch transistor PM0' (replacing the PM0 in descriptions of FIG. 5) of the second pixel circuit 4112 as well as the resistive transistor PM1, the second switch transistor PM2 and the pull up transistor PM3 of the output circuit 411S are identical to FIG. 4 and based on the signal timing diagram of FIG. 5. Within the exposure period of the second pixel circuit row, the output signal generated by the output circuit 411S is referred to a second output voltage.

The operations of other pixel circuits are similar to the above first and second pixel circuits 4111' and 4112, and thus are not repeated herein.

More specifically, the operation of every pixel circuit at each pixel circuit column is performed by the avalanche diode and the select switch transistor thereof in conjunction with the resistive transistor PM1, the second switch transistor PM2 and the pull up transistor PM3 of the output circuit 411S. Each output circuit 411S generates an output voltage within the exposure period of each pixel circuit for the corresponding counter 13 to count the photon event.

Each of the pulling circuits 42 is used to pull down the first output voltage or the second output voltage after a photon event of the first output voltage or the second output voltage is read.

As mentioned above, although the SPAD can be used to detect extremely weak light and high frequency signals, it still needs to operate in corporation with the quenching circuit. Poor circuit design can influence the minimum pixel size and fill factor. Accordingly, the present disclosure further provides an image sensor, the quenching and readout circuit thereof (e.g., FIGS. 1 and 4) and an operating method of the image sensor (e.g., FIGS. 2-3 and 5-6) that have simple circuit structure, low pixel size limitation and high fill factor.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An image sensor, comprising:
a pixel array, comprising a pixel circuit group arranged in a column of the pixel array, the pixel circuit group comprising:
a first avalanche diode, being coupled to a node via a first switch transistor and generating avalanche currents corresponding to a first exposure signal;
a second avalanche diode, being coupled to the node via a third switch transistor and generating avalanche currents corresponding to a second exposure signal;
a resistive transistor, being connected to the node for draining a voltage of the node to a predetermined voltage;
a pull down transistor, a gate of the pull down transistor connected to the node; and a second switch transistor, a gate of the second switch transistor configured to receive the first exposure signal or the second exposure signal corresponding to different exposure periods to generate a first output voltage or a second output voltage; and a readout line, coupled to a drain of the second switch transistor to output the first output voltage or the second output voltage.

2. The image sensor as claimed in claim 1, wherein a gate of the first switch transistor is configured to receive the first exposure signal, a gate of the third switch transistor is configured to receive the second exposure signal, and wherein the first and second exposure signals are corresponding to exposure periods of different pixel circuit rows of the pixel array.

3. The image sensor as claimed in claim 1, further comprising a pulling circuit, wherein the pulling circuit is coupled to the readout line for pulling the first output voltage or the second output voltage to a voltage level after a photon event of the first output voltage or the second output voltage is read.

4. The image sensor as claimed in claim 1, further comprising a counter coupled to the pixel circuit group and configured to count photon events of the first output voltage or the second output voltage.

5. The image sensor as claimed in claim 1, wherein the resistive transistor is configured to receive a fixed voltage signal to determine resistance of the resistive transistor.

6. An image sensor, comprising:

a pixel array, comprising a plurality of pixel circuits arranged in one pixel circuit column, each of the pixel circuits comprising:

an avalanche diode, being coupled to a node and generating an avalanche current corresponding to an exposure signal; and an output circuit, configured to be coupled to the one pixel circuit column, and comprising:

a resistive transistor, being connected to the node for draining a voltage of the node to a predetermined voltage;

a pull down transistor, a gate of the pull down transistor connected to the node; and a second switch transistor, a gate of the second switch transistor configured to receive the exposure signal corresponding to an exposure period to generate an output voltage; and a readout line, coupled between the node and each of the pixel circuits in the one pixel circuit column.

7. The image sensor as claimed in claim 6, wherein the resistive transistor, the pull down transistor, and the second switch transistor are P-type transistor.

8. The image sensor as claimed in claim 6, further comprising:

a pulling circuit, wherein the pulling circuit is coupled to the readout line for pulling the output voltage to a voltage level after a photon event of the output voltage is read.

9. The image sensor as claimed in claim 6, further comprising:

a counter coupled to the one pixel circuit column and configured to count photon events of the output voltage.

10. The image sensor as claimed in claim 6, wherein the resistive transistor is configured to receive a fixed voltage signal to determine resistance of the resistive transistor, and the exposure signal is a row selection signal.

11. An image sensor, comprising:

a pixel array, comprising a pixel circuit group arranged in a column of the pixel array, the pixel circuit group comprising:

a photon-detect unit, comprising a first avalanche diode and a second avalanche diode, the first avalanche diode being coupled to a node via a first transistor and generating avalanche currents corresponding to a first exposure signal and the second avalanche diode being coupled to the node via a second transistor and generating avalanche currents corresponding to a second exposure signal;

a resistive transistor, being connected to the node for draining a voltage of the node to a predetermined voltage;

a pull down transistor, a gate of the pull down transistor connected to the node; and a switch transistor, a gate of the switch transistor configured to receive the first exposure signal or the second exposure signal corresponding to different exposure periods to generate a first output voltage or a second output voltage; and a readout line, coupled to a drain of the switch transistor to output the first output voltage or the second output voltage.

12. The image sensor as claimed in claim 11, wherein a drain of the first transistor is connected to an anode of the first avalanche diode, a gate of the first transistor is configured to receive the first exposure signal, and a source of the first transistor is connected to the node.

13. The image sensor as claimed in claim 11, wherein a drain of the second transistor is connected to an anode of the second avalanche diode, a gate of the second transistor is configured to receive the second exposure signal, and a source of the second transistor is connected to the node.

14. The image sensor as claimed in claim 11, further comprising:

a pulling circuit, wherein the pulling circuit is coupled to the readout line for pulling the first output voltage or the second output voltage to a voltage level after a photon event of the first output voltage or the second output voltage is read.

15. The image sensor as claimed in claim 11, further comprising:

a counter coupled to the pixel circuit group and configured to count photon events of the first output voltage or the second output voltage.

16. The image sensor as claimed in claim 11, wherein a gate of the resistive transistor is configured to receive a fixed voltage signal, the first exposure signal and the second exposure signal are row selection signals to sequentially activate an exposure period, and the fixed voltage signal is configured to determine resistance of the resistive transistor.

* * * * *